United States Patent
Marotta et al.

(10) Patent No.: US 6,911,862 B2
(45) Date of Patent: Jun. 28, 2005

(54) ULTRA-LOW CURRENT BAND-GAP REFERENCE

(75) Inventors: Giulio Giuseppe Marotta, Contigliano (IT); Alessandro Torsi, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/924,186

(22) Filed: Aug. 23, 2004

(65) Prior Publication Data

US 2005/0017794 A1 Jan. 27, 2005

Related U.S. Application Data

(63) Continuation of application No. 10/365,675, filed on Feb. 12, 2003, now Pat. No. 6,801,079.

(30) Foreign Application Priority Data

Oct. 4, 2002 (IT) .................................. RM2002A0500

(51) Int. Cl.[7] .............................................. G05F 1/10
(52) U.S. Cl. ...................................... 327/539; 327/569
(58) Field of Search ................................ 323/312, 313, 323/314, 315; 327/530, 534, 535, 537, 538, 539, 543, 564, 565, 566

(56) References Cited

U.S. PATENT DOCUMENTS

| 4,339,707 | A | | 7/1982 | Gorecki |
|---|---|---|---|---|
| 4,849,933 | A | | 7/1989 | Allen |
| 5,570,008 | A | | 10/1996 | Goetz |
| 6,002,245 | A | * | 12/1999 | Sauer .......................... 323/315 |
| 6,009,022 | A | | 12/1999 | Lee |
| 6,150,871 | A | * | 11/2000 | Yee ............................. 327/538 |
| 6,157,245 | A | | 12/2000 | Rincon-Mora |
| 6,255,807 | B1 | | 7/2001 | Doorenbos |
| 6,294,902 | B1 | | 9/2001 | Moreland et al. |
| 6,507,179 | B1 | | 1/2003 | Jun |
| 6,570,437 | B2 | | 5/2003 | Park |
| 2003/0117120 | A1 | | 6/2003 | Amazeen |
| 2003/0137342 | A1 | | 7/2003 | Opris |
| 2003/0202380 | A1 | | 10/2003 | Marotta |

* cited by examiner

Primary Examiner—Jeffrey Zweizig
(74) Attorney, Agent, or Firm—Leffert Jay & Polglaze, P.A.

(57) ABSTRACT

A band gap voltage reference for an NMOS memory device includes a plurality of horizontal gate bipolar junction transistors that show improved gain at low collector currents. The horizontal gate bipolar transistors include an emitter formed by the NMOS memory device n+ source region, a base formed by the NMOS memory device p+ channel region, and a collector formed by the NMOS memory device n+ drain region, in which the base/channel region is less than 0.4 μm in width and advantageously may be fabricated by standard flash memory manufacturing processes.

37 Claims, 6 Drawing Sheets

ULTRA-LOW CURRENT BAND-GAP REFERENCE

RELATED APPLICATIONS

This is a continuation application of U.S. patent application Ser. No. 10/365,675, filed Feb. 12, 2003, titled "Ultra-Low Current Band-Gap Reference," which issued as U.S. Pat. No. 6,801,079 on Oct. 5, 2004 and claims priority to Italian Patent Application Serial No. RM2002A000500, filed Oct. 4, 2002, entitled "Ultra-Low Current Band-Gap Reference," both of which are commonly assigned.

TECHNICAL FIELD

The present invention is related in general to a voltage reference generator for an integrated circuit (IC), and, in particular, to a voltage reference generator for a flash memory for a portable device such as a cellular telephone.

BACKGROUND INFORMATION

In many integrated circuits and particularly in flash memories such as for use in cellular telephones and the like, a voltage reference generator circuit is used. The output of the voltage reference is needed in many blocks of the IC for a variety of functions. Some important requirements for a voltage reference generator for flash memories for use in portable instruments such as cellular phones include:

1. Stability over the extended temperature range from −40 to +85 degrees C.;
2. Stability over process parameter ranges;
3. Low voltage operation to reduce power consumption;
4. Low current drawn from the power supply in active and standby modes of operation to extend the battery life (the voltage reference circuit is generally also left on in the flash standby mode to allow fast recovery from standby); and
5. Low cost deriving from both small silicon real estate and by avoiding extra process steps needed to build non-standard devices to implement the voltage reference circuit.

One example of a design for a voltage reference circuit is the band gap voltage reference (BGVR) circuit. While this circuit has been successfully used in a number of applications, unfortunately it is not well suited for flash memory circuits in portable battery operated devices such as cellular telephones and the like, where low current consumption and low operating voltages are required for at least the following reasons:

The minimum operating Vcc power supply for a cellular telephone is increasingly very low, for example, present devices have a nominal Vcc as low as 1.42 V, ruling out many of the available variations of the BGVR;

Stability over a wide temperature range and process variations is necessary for flash memories used in portable battery operated devices. BGVRs are typically not sufficiently stable for practical needs of other parts of the memory served by the BGCR output;

The current drawn by state-of-art BGVRs is typically not less than 10 $\mu$A, which is too much for a cellular telephone or similar battery operated flash memory application; and Bipolar transistors, key components in the BGVR, such as those that are available in standard flash memory manufacturing processes, do not have adequate performances for a quality BGVR circuit.

Accordingly, what is needed is a simple band-gap voltage reference circuit for a portable flash memory device such as a cellular telephone that will work at acceptable voltages and currents over an extended temperature range and have adequate process stability, using a standard flash technology.

The above-mentioned problems with band-gap voltage reference circuits, as well as other problems, are addressed by the present invention and will be understood by reading and studying the following specification.

SUMMARY

A band-gap voltage reference circuit according to one aspect of the present invention includes a plurality of horizontal gate bipolar junction transistors that show improved gain at low collector currents. The horizontal gate bipolar transistors include an emitter formed by the NMOS memory device n+ source region, a base formed by the NMOS memory device p+ channel region(when the NMOS is off), and a drain formed by the NMOS memory device n+ collector region, in which the base/channel region is less than 0.4 $\mu$m in width. Advantageously, the circuit may be fabricated by standard flash memory manufacturing processes. Other advantages and aspects of the present invention will become apparent to those of ordinary skill in the art after examining the detailed description which appears below.

DETAILED DESCRIPTION

In the following detailed description of the preferred embodiments, reference is made to the accompanying drawings that form a part hereof, and in which are shown by way of illustration specific embodiments in which the invention may be practiced. It is to be understood that other embodiments may be utilized and structural changes may be made without departing from the scope of the present invention.

Figure 1:
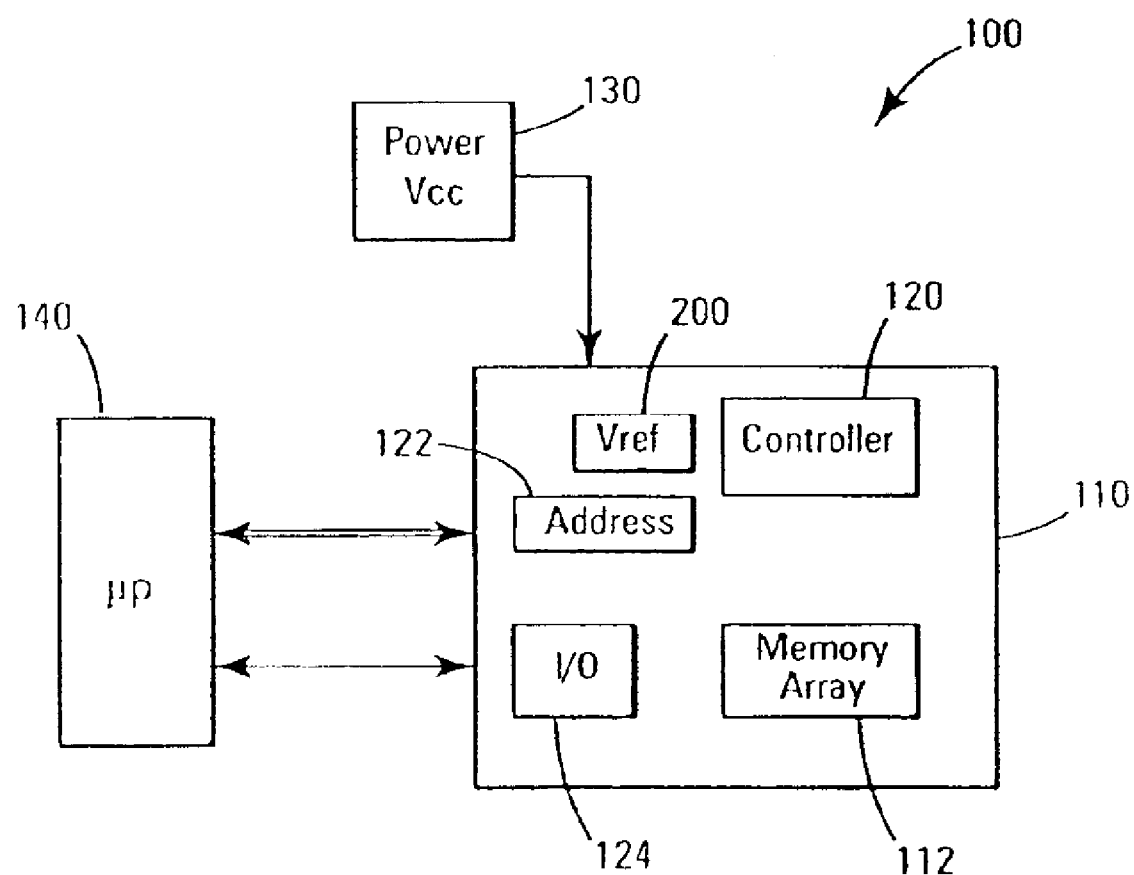
FIG. 1 shows a computer system including a memory circuit, a power supply, and an on-chip reference voltage source according to the teachings of the present invention.

FIG. 1 shows a computer system 100 including a memory circuit 110, a power supply 130, a band gap voltage reference source 200 for providing stable reference voltages for operation of the memory and a processor 140. Memory 110 includes a memory array 112 of nonvolatile memory cells (which may be flash memory), and a controller 120 that controls detailed operations of memory 110 such as the various individual steps necessary for carrying out writing, reading, and erasing operations. Memory 110 also includes an address decoder circuit 122 for decoding and selecting addresses provided by processor 140 to access appropriate memory cells in memory array 112, and an I/O circuit 124 for providing bi-directional communications between processor 140 and memory circuit 110.

Figure 2:
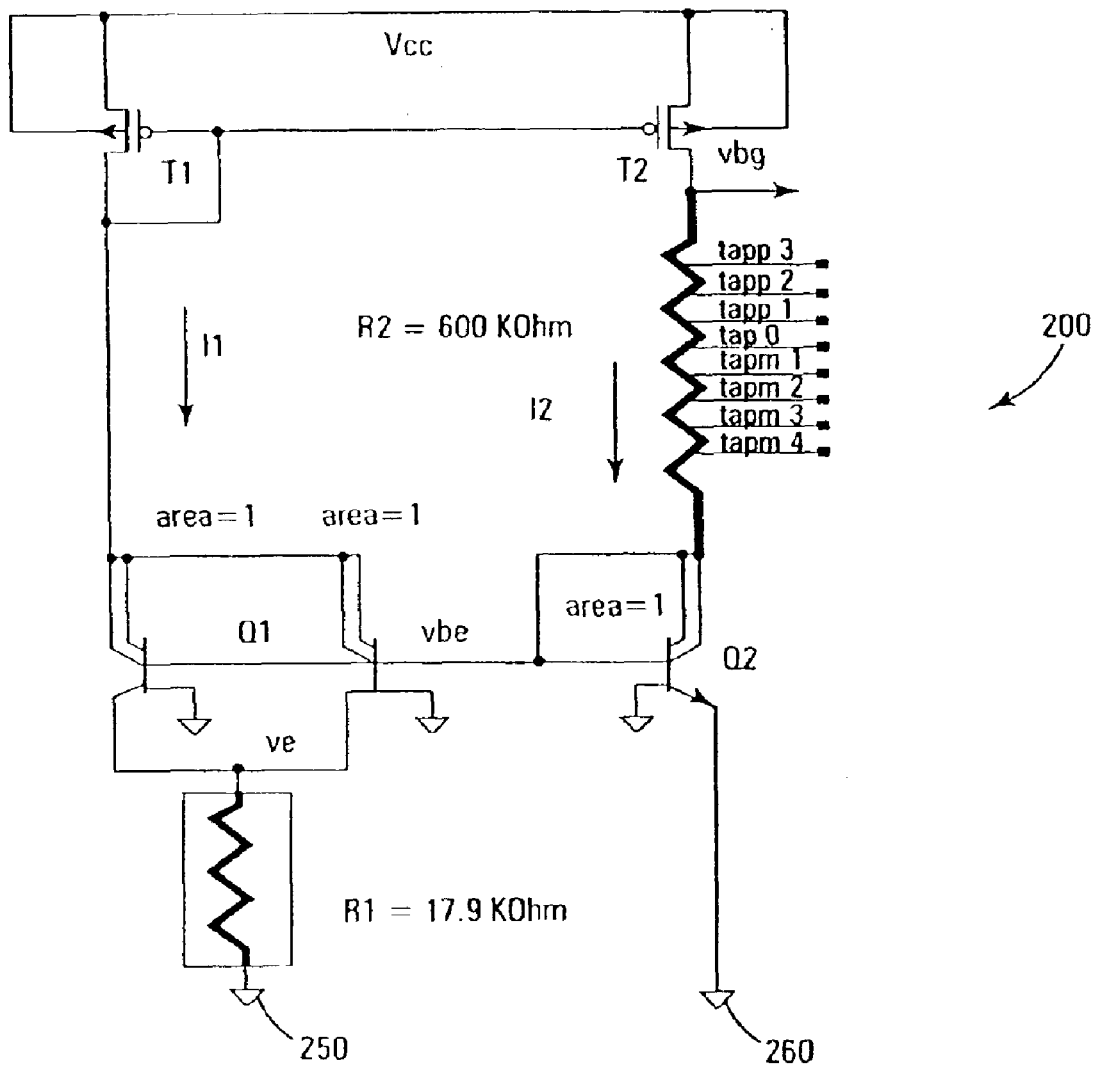
FIG. 2 shows an illustration of one embodiment of band-gap voltage reference circuit according to the teachings of the present invention.

A more detailed drawing of a basic band gap voltage reference (BGVR) 200 according to the present invention is shown in FIG. 2. BGVR 200, as constructed according to the present invention, is capable of working at low power supply voltages and of providing stable reference voltages needed to operate a flash memory circuit in a portable device such as cellular telephone. In this circuit, bipolar transistors $Q_2$ and $Q_1$ are respectively of area 1 and of area N (i.e., N times greater than area 1). Q1 and Q2 are symmetrical in layout. To simplify fabrication, Q1 may be constructed of a number N of individual transistors each having an area of 1. BVGR 200 also includes a pair of PMOS transistors, $T_1$ and $T_2$. The source/drain of $T_1$ is connected between the collector of Q1 and Vcc and the source/drain of T2 is connected between Vcc and tapped resistor R2 which in turn is connected to the collectors of Q2 (the double collector feature of Q1 and Q2 shown in FIG. 2 will be explained below). The emitter(s) of Q1 are connected to a common reference or ground 250 through R1, which in this example is a 17.9 K Ohm resistor. The emitter of Q2 is connected to a common reference or ground 260.

The gate of T1 is tied to the gate of T2 and is also connected to the collector of Q1. The bases of Q1 and Q2 are tied together and also connected to collector of Q2. To a good approximation, the currents $I_1$ and $I_2$ are the same. In fact, $I_1$ and $I_2$ flow through $T_1$ and $T_2$, which have the same gate and source voltages. The drain voltage however is actually slightly different, but since the gate and the drain of $T_1$ are shorted, this transistor is saturated. In such condition, because of the typical I–$V_{ds}$ characteristics of the MOS transistor with $V_{gs}$=constant, the variation of the current due to variations of $V_{ds}$ is negligible. Even if $V_{ds2}$ is slightly different from $V_{ds1}$, to a good approximation $$I_1 = I_2 \tag{1}$$

In other words, $I_2$, is the "mirrored" current of $I_1$. The circuit formed by $T_1$ and $T_2$ is commonly referred to as a current mirror.

From the basic silicon junction diode equation, the forward current $I_b$ of the base-emitter diode of bipolar transistors such as Q1 and Q2 is:

$$I_b = I_0 e^{V_{be}/V_t} \tag{2}$$

where:

$I_0$=diode saturation current, proportional to the area of the base-emitter;

$V_{be}$=base-emitter voltage;

$V_t$=kT/q; and:

k=Boltzmann constant;

T=absolute temperature; and q=electron charge.

Since the base-emitter area of $Q_1$ is N times greater than the base-emitter area of $Q_2$, $$I_{b1} = NI_0 e^{(V_{be}-V_e)/V_t} \tag{3}$$

$$I_{b2} = I_0 e^{V_{be}/V_t} \tag{4}$$

The collector currents $I_{c1}$ and $I_{c2}$ are:

$$I_{c1} = \beta_1 I_{b1} \tag{5}$$

$$I_{c2} = \beta_2 I_{b2} \tag{6}$$

where $\beta 1$ and $\beta 2$ are the gains ($h_{fe}$) of transistors $Q_1$ and $Q_2$. $\beta 1$ and $\beta 2$ are a function of the bipolar transistor characteristics (which are the same for $Q_1$ and $Q_2$ since they are on the same chip) and are also a function of the current flowing through the transistors. From Kirkhoff's first law applied to the collector node of $Q_2$:

$$I_2 = I_{c2} + I_{b1} + I_{b2} \tag{7}$$

Assuming $\beta 1$ and $\beta 2$ quite large, $I_{b1}$ and $I_{b2}$ can be ignored in a first approximation. Therefore:

$$I_{c2} = I_2 \tag{8}$$

Since $$I_1 = I_{c1} \tag{9}$$

From Equations (8), (9) and (1), $$I_{c2} = I_{c1} \tag{10}$$

If it is assumed that:

$$\beta_1 = \beta_2 \tag{11}$$

and from Equations (5), (6), (10) and (11) it can be determined that:

$$I_{b2} = I_{b1} \tag{12}$$

from Equations (3), (4) and (12):

$$NI_0 e^{(V_{be}-V_e)/V_t} = I_0 e^{V_{be}/V_t} \tag{13}$$

Rewriting Equation (13):

$$V_e = V_t \ln N = (kT \ln N)/q \tag{14}$$

Now $$V_{bg} = V_{be} + R_2 I_2 \tag{15}$$

and $$I_1 = V_e/R_1 + I_{b1} = V_e/R_1 + I_{c1}/\beta_1 \tag{15'}$$

Assuming $\beta 1$ is quite large, the term $I_{c1}/\beta_1$ may be neglected, thus $$I_1 = V_e/R_1 \tag{16}$$

From Equations (1) and (16):

$$I_2 = V_e/R_1 \tag{17}$$

From Equations (14), (15) and (17):

$$V_{bg} = V_{be} + R_2 kT \ln N/R_1 q \tag{18}$$

It is well known that $V_{be}$ changes with temperature, typically reducing its value by −2 mV/Degree C. for a junction silicon diode. By proper selection of $R_2$, N and $R_1$ it is possible to have $R_2$ kT ln N/$R_1$q change by +2 mV/deg C., therefore compensating for the temperature induced changes in $V_{bg}$.

Writing Equation (18) for two different temperatures $T_1$ and $T_2$ ($T_2 > T_1$)

$$V_{bg2} = V_{be2} + R_2 kT_2 \ln N/R_1 q \tag{19}$$

$$V_{bg1} = V_{be1} + R_2 kT_1 \ln N/R_1 q \tag{20}$$

From Equations (19) and (20):

$$V_{bg2}-V_{bg1}=V_{be2}-V_{be1}+R_2k(T_2-T_1) \ln N/R_1q \quad (21)$$

The values of $R_2$, N, and $R_1$ should be such that there is no variation of band gap voltage with changes in temperature. Thus, the left hand side of Equation (21) is set to 0.

$$0=V_{be2}-V_{be1}+R_2k(T_2-T_1) \ln N/R_1q \quad (23)$$

Hence, $$V_{be2}-V_{be1}=-R_2k(T_2-T_1) \ln N/R_1q \quad (24)$$

$$V_{be2}-V_{be1}/(T_2-T_1)=-R_2k \ln N/R_1q$$

As noted, the $V_{be}$ variation with temperature for a junction silicon diode is −2 mV/ DegC.
Thus, $$-2\times 10^{-3}=-R_2k \ln N/R_1q \quad (25)$$

and $$R_2=2R_1q/10^3k \ln N \quad (26)$$

For stability of BGVR circuit 200 over process variations, bipolar transistors Q1 and Q2 must be drawn exactly with the same layout. Since the emitter of Q1 is N times greater than the emitter of Q2, one simple approach for Q1 is to draw N transistors identical to Q2 and tie together their collectors, their bases and their emitters. This implies that N is an integer number. To minimize silicon area and because N must be greater than 1, N=2 is selected.

$$R_2=2R_1q/10^3k \ln 2 \quad (27)$$

From Equation (27) there are numerous possible choices of values for $R_2$ and $R_1$. An additional condition can be used to set the value $R_2$ and $R_1$ setting the current consumption of the BGVR circuit at ambient temperature.

$$i_e=V_e/R_1 \quad (28)$$

From Equation (14) and using N=2:

$$i_e=kT \ln 2R_1q \quad (29)$$

Setting $i_e$=1 µA:

$$R_1=10^{-6}kT \ln 2/q \quad (30)$$

Substituting in Equation (27):

$$R_2=2 \ 10^3T \quad (31)$$

For T=300° K $$R_2=600 \text{ K'}\Omega \quad (32)$$

At the same T=300° K, using actual values of the Boltzmann constant k=1.38×10$^{-23}$ and of the electron charge q=1.602×10$^{-19}$:

$$R1=17.9 \text{ K'}\Omega \quad (33)$$

The above values of $R_1$ and $R_2$ may thus be used for a temperature compensated BGVR.

Figure 3A:
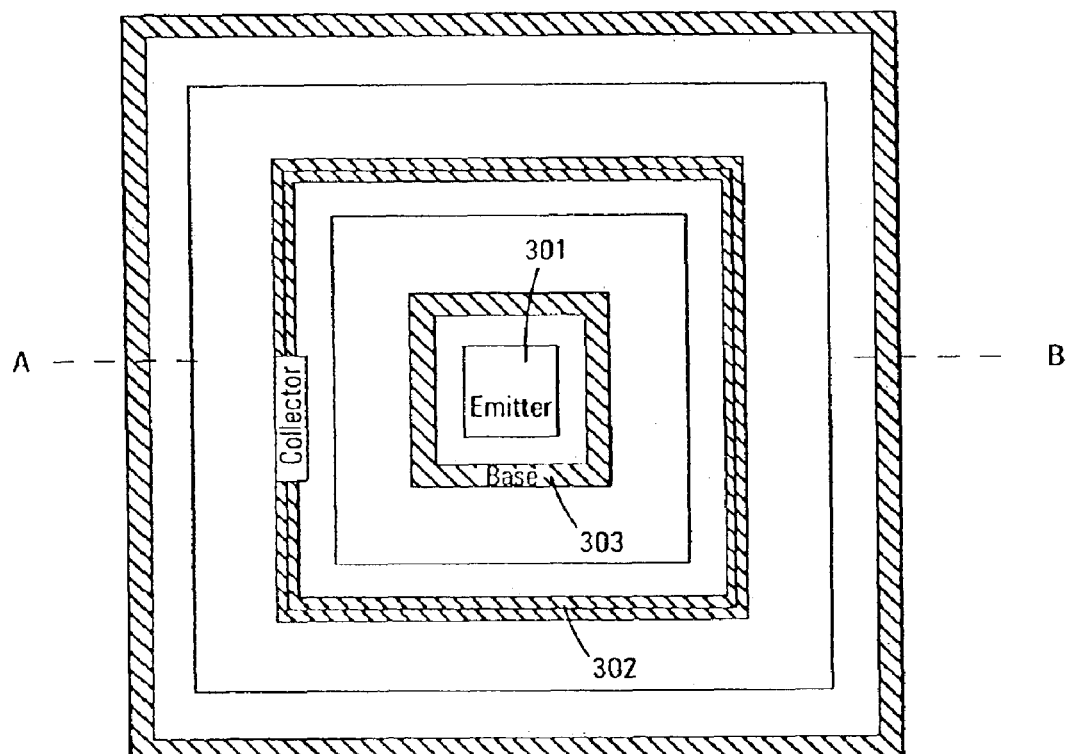
FIGS. 3a and 3b are layout and cross-section views, respectively, of a vertical NPN transistor which may be utilized in embodiments of the present invention.
Figure 3B:
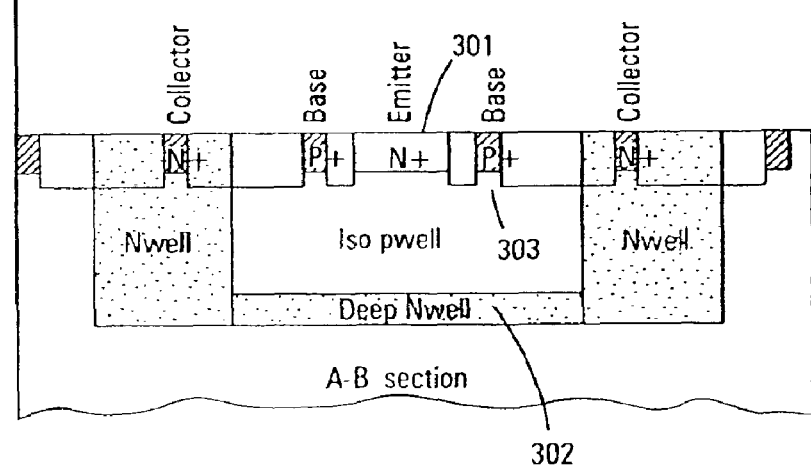
Figure 4:
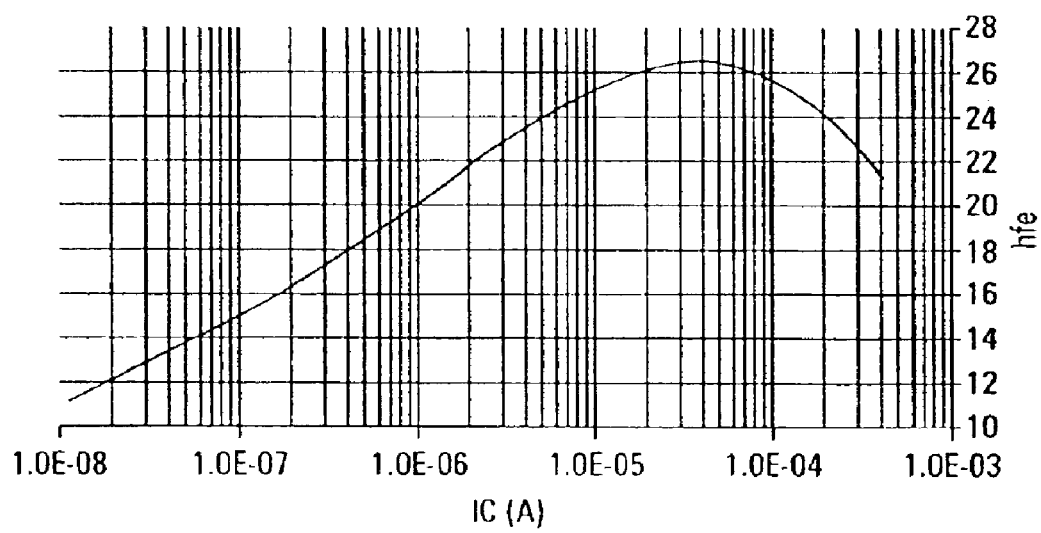
FIG. 4 is a graph of the transistor gain (hfe) versus collector current (Ic) for a vertical NPN transistor found in a memory manufactured by a standard flash memory process.

The above calculations are all based on the assumption that $h_{fe}$ (the "gain" or β of the bipolar transistors) is quite high. Unfortunately, high gain bipolar transistors have not been available in standard flash memory fabrication processes. One configuration of bipolar transistor, in theory, available in standard flash memory technology, is the vertical NPN bipolar transistor, i.e., a transistor in which the emitter, base and collector are aligned along a line perpendicular to the wafer surface. With reference to FIGS. 3a and 3b, vertical NPN bipolar transistors are formed by n+ diffusion region 301 as emitter, an n+ diffusion region 302 (deep Nwell) as vertical collector, and a p+ diffusion region 303 used as base. However, there is a practical problem with the vertical bipolar transistors available in standard flash memory technology. To ensure the validity of the relationships of Equations (8), (16) and (29), the $h_{fe}$ (the β or "gain" of bipolar transistors) must be the highest possible. It is thus desirable to select a value of $I_e$ that maximizes $h_{fe}$. FIG. 4 shows a graph of $h_{fe}$ versus collector current for typical vertical NPN bipolar transistors found in standard flash processes. Unfortunately, from the characteristics shown in FIG. 4, $h_{fe}$ max is ~26 for $I_c$ between 20 and 80 µA. Moreover, this current is too high for an acceptable standby current of a flash memory chip designed for use in cellular telephone and other low power flash memory applications. Setting a maximum total current of 2 µA (1 µA for each of the two branches of the BGVR circuit), $h_{fe}$ comes down to ~20. The above calculations are based on the assumption that β1 and β2 are quite large. For $h_{fe}$=20, the relationships of Equations (8), (16) and (29) become inaccurate enough to impair the overall stability of the BGVR circuit. In particular, it can be demonstrated that, for vertical NPN bipolar transistors such as are found in standard flash memories, with $h_{fe}$=20, the temperature stability over the extended temperature range of −40/+85 deg C. is −14% to 8%. Such variations are generally unacceptable for flash memories devices intended for cellular phones and other applications where extended range temperature stability and low power consumption must be observed.

In an effort to overcome the foregoing problems, some variations have been introduced in the basic band gap reference circuit. For example, "Temperature Compensated Ultra-Low Voltage Band-Gap Reference" by Giulio Marotta and Agostino Macerola, Italian Patent Application Serial No. RM2002A000236, filed on Apr. 30, 2002 (U.S. Patent application Ser. No. 10/365,586, filed on Feb. 12, 2003), commonly assigned with the present invention and incorporated herein by reference as if fully set forth, represents one effort to improve the basic band gap reference circuit. Even with the variation shown in that application, standby current needs to be not less than about 10–12 µA for an acceptable compromise on temperature stability. As the foregoing calculations show, another solution to the problem would be to use bipolar transistors with high $h_{fe}$. This solution has the advantage of avoiding implementing circuit variations to the basic band gap reference circuit. Unfortunately, as noted, the basic vertical NPN bipolar transistors found in standard flash memory technology do not provide high enough gain.

There is another bipolar transistor that can be found in standard flash memory technology. This transistor is "lateral" or "horizontal" since it has the emitter, base and collector junctions on a plane parallel to the silicon wafer surface. One such horizontal bipolar transistor is formed by the NMOS source region (n+ as emitter), the channel region when the NMOS is off (as the base), and the NMOS drain region (n+ as the collector). Unfortunately, the horizontal bipolar transistor in standard flash memory has demonstrated poor $h_{fe}$. Because of the poor gain performance such transistors have been considered to be impractical and treated as gate parasitic transistors, i.e., devices that detract from the performance of other circuit elements and are shut off in any working mode of the chip. As MOS technology has improved over the years, the channel length of the standard MOS transistor has been reduced accordingly. As channel lengths have approached values as low as 0.18 mm or less for low voltage NMOS transistors (0.32 mm for high voltage NMOS transistors), the base width of the horizontal bipolar transistors has correspondingly been reduced. Because of these structural changes the performance of the horizontal bipolar transistor is now greatly improved. Such devices are referred to herein as Gate Bipolar Junction Transistors (GBJTs) because their characteristics are also a function of the gate voltage bias. In particular, for short channel lengths, GBJTs show a significantly higher and thus more useful $h_{fe}$.

Figure 5A:
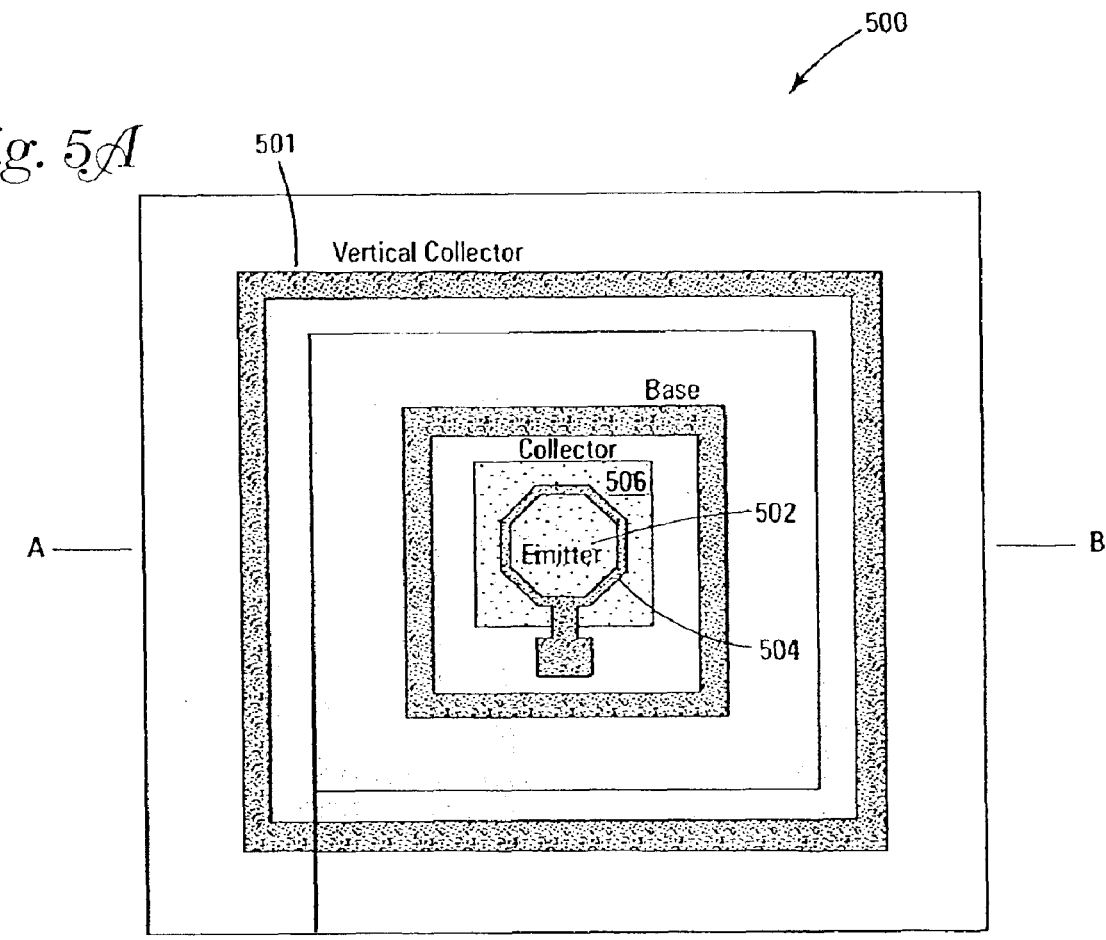
FIGS. 5a and 5b are layout and cross-section views, respectively, of a lateral bipolar transistor which may be utilized in embodiments of the present invention.
Figure 5B:
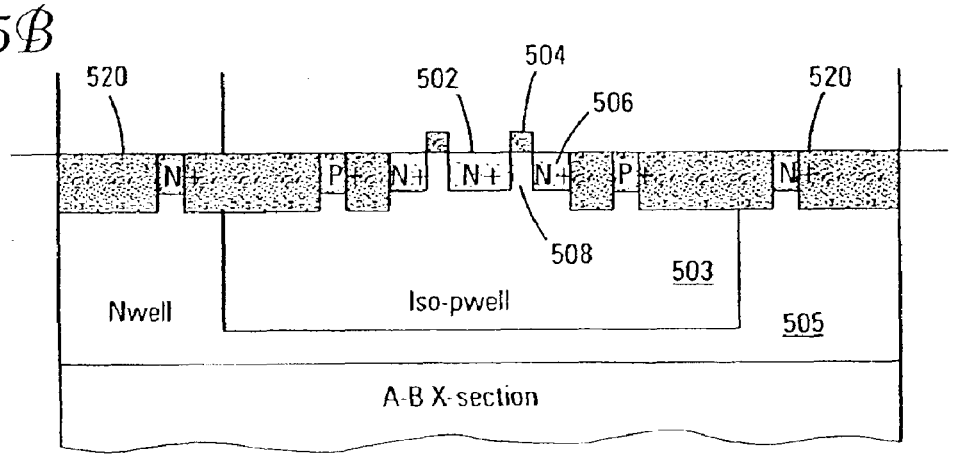

Referring to FIGS. 5a and 5b, a top view and cross-section, respectively, of a horizontal GBJT structure 500 according to the present invention includes an emitter 502 made by the same n+ diffusion process used in fabricating the source/drain for standard NMOS transistors, a gate 504, with a base region 508 underneath the gate 504, and with a collector region 506 surrounding the gate 504, also made by the n+ diffusion process used in fabricating the source/drain for NMOS transistors. It should be noted that the vertical NPN transistors formed from n+ NMOS source/drain regions 502 and 506 (emitter), Iso-pwell 503 (base), and deep well 505 (collector), are also present in parallel with the GBJT. This accounts for the double collector found in the symbol of the GBJTs used in the schematic of FIG. 2.

Figure 6:
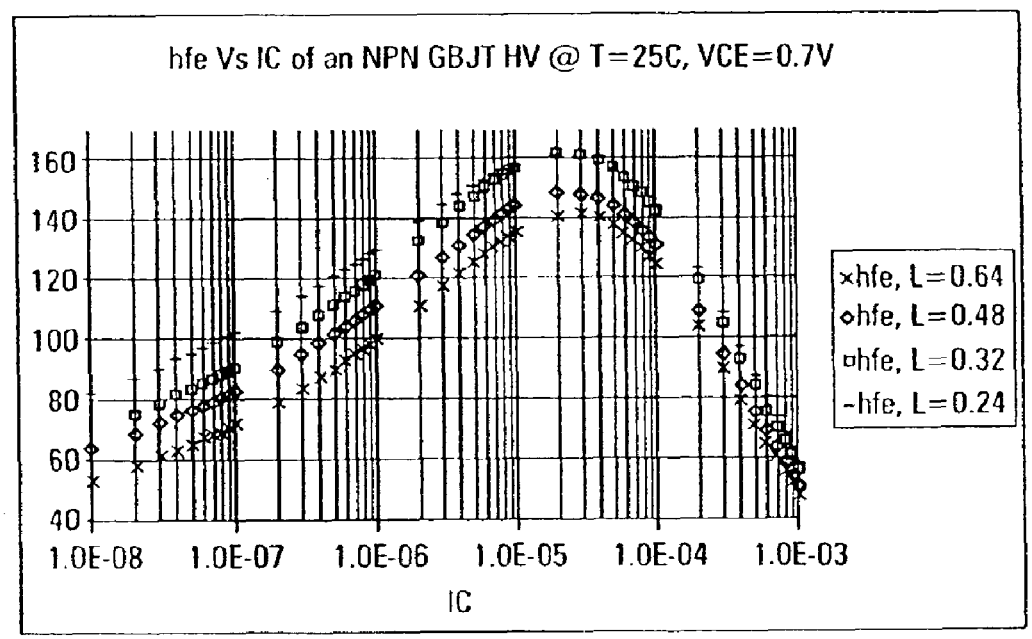
FIG. 6 is a graph of the transistor gain ($h_{fe}$) versus collector current ($I_c$) for an NPN gated bipolar junction transistor according to the present invention.

One example of the $h_{fe}$ curves of the GBJT of structure 500, with the gate grounded, is plotted in FIG. 6 with different values of the channel length (=base width). As shown by the legend on FIG. 6, an "X" designates the $h_{fe}$ curve relative to a BJT transistor of length L=0.64 microns. Similarly, the $h_{fe}$ curve relative to a BJT transistor of length L=0.48 microns is designated in the legend by "o." The other two curves, related to BJT's of L=0.32 and L=0.24 microns, are charted as sequences of small squares "[ ]" and "–" respectively. The $h_{fe}$ is 120 for a base width L=0.32 mm and with a collector (emitter) current of 1 $\mu$A. With $h_{fe}$=120 the relationships of Equations (8), (16) and (29) can be considered valid to a much higher approximation. Thus, a sufficiently high temperature stability is achieved of +/–1% over the extended temperature range, and the overall current drawn by the BGVR is only ~2 $\mu$A.

One example of a schematic of the BGVR circuit using Gate Bipolar Junction Transistors according to the present invention is shown in FIG. 2 where the R2=600 K'Ω resistor has been designed with taps in order to allow trimming of the voltage reference. Other designs and variations on this circuit and other applications of the present invention will be readily apparent to those of ordinary skill in the art.

CONCLUSION

A voltage reference generator has been described. The voltage reference generator includes a number of horizontal Gate Bipolar Junction Transistor (GBJT) that exhibit a higher and thus more useful $h_{fe}$ at collector currents that are 10 $\mu$A and below and can be used in a band-gap voltage reference circuit for integrated circuits and in particular for a portable flash memory device such as a cellular telephone working at acceptable voltages and currents with acceptable temperature and process stability, using a standard flash technology.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A band-gap voltage reference for an integrated circuit comprising:
   a means for providing a mirrored current, the mirrored current means generating a first and second equal currents;
   a first horizontal bipolar junction transistor having a collector coupled to the first current of the mirrored current means;
   a second horizontal bipolar junction transistor having a collector coupled to the second current of the mirrored current means through a means for providing a first resistance, an emitter coupled to a common reference and a base coupled to the collector of the second horizontal bipolar transistor and a base of the first bipolar transistor; and
   a means for providing a second resistance coupled between an emitter of the first bipolar junction transistor and the common reference.

2. The band gap voltage reference of claim 1, wherein the first bipolar junction transistor is comprised of a means for providing a plurality of horizontal gate bipolar junction transistors having a combined base emitter area of area N and the second bipolar junction transistor is comprised of a means for providing a horizontal gate bipolar junction transistor having a base emitter area of area 1.

3. The band gap voltage reference of claim 1, wherein the base region of the first or second horizontal bipolar gate transistor is less than 0.4 $\mu$m in width.

4. A nonvolatile memory device, comprising:
   a memory array of nonvolatile memory cells; and
   a band-gap voltage reference, the band gap voltage reference comprising:
     a means for providing a mirrored current, the mirrored current means generating a first and second equal currents;
     a first horizontal bipolar junction transistor having a collector coupled to the first current of the mirrored current means;
     a second horizontal bipolar junction transistor having a collector coupled to the second current of the mirrored current means through a means for providing a first resistance, an emitter coupled to a common reference and a base coupled to the collector of the second horizontal bipolar transistor and a base of the first bipolar transistor; and
     a means for providing a second resistance coupled between an emitter of the first bipolar junction transistor and the common reference.

5. The nonvolatile memory device of claim 4, wherein the means for providing the first resistance is comprised of a plurality of taps to enable trimming of the band gap voltage reference.

6. The nonvolatile memory device of claim 4, wherein one or more of the horizontal gate bipolar transistors are in parallel with a vertical NPN bipolar junction transistor.

7. The nonvolatile memory device of claim 4, wherein the first and second horizontal gate bipolar junction transistors are matched such that the base emitter area of the first horizontal bipolar junction transistor is N times the base emitter area of the second horizontal bipolar junction transistor.

8. The nonvolatile memory device of claim 7, wherein the first horizontal gate bipolar junction transistor further comprises two or more horizontal gate bipolar junction transistors coupled in parallel.

9. The nonvolatile memory device of claim 4, wherein the horizontal gate bipolar junction transistors are comprised of:
   an emitter formed from an n+ source region of an NMOS device;
   a base region formed from the channel of the NMOS device adjacent to the n+ source region and having a width of L=0.5 µm or less;
   a gate positioned above and in contact with the base region; and
   a collector formed from the drain region of the NMOS device and adjacent to the base region.

10. A method for operating a band gap voltage reference, comprising:
   providing first and second currents, wherein the first and second currents are substantially equal;
   coupling a collector of a first horizontal bipolar junction transistor to the first current source;
   coupling a collector of a second horizontal bipolar junction transistor to the second current through a first resistance;
   coupling an emitter of the second horizontal bipolar junction transistor to a common reference;
   coupling a base of the second horizontal bipolar junction transistor to the collector of the second horizontal bipolar transistor and a base of the first horizontal bipolar transistor; and
   coupling a second resistance between the emitter of the first horizontal bipolar junction transistor and the common reference.

11. The method of claim 10, wherein the first and second horizontal gate bipolar junction transistors, further comprise:
   an emitter formed from a first source/drain region of a MOS device;
   a base region formed from the channel of the MOS device adjacent to the first source/drain region and having a width of L=0.5 µm or less; and
   a collector formed from a second source/drain region of the MOS device and adjacent to the base region.

12. The method of claim 10, wherein the first and second horizontal gate bipolar transistors has a gain of at least 100 when the collector current is not more than 10 µA.

13. The method of claim 10, wherein one or more of the horizontal gate bipolar transistors are in parallel with a vertical NPN bipolar junction transistor.

14. The method of claim 10, wherein the first and second horizontal gate bipolar junction transistors are matched such that the base emitter area of the first horizontal bipolar junction transistor is N times the base emitter area of the second horizontal bipolar junction transistor.

15. The method of claim 14, wherein the first horizontal gate bipolar junction transistor further comprises two or more horizontal gate bipolar junction transistors coupled in parallel.

16. A band-gap voltage reference for an integrated circuit comprising:
   a current mirror coupled to a power source;
   a first bipolar junction transistor having a collector coupled to the current mirror;
   a second bipolar junction transistor having a collector coupled to the current mirror through a first resistor, an emitter coupled to a common reference and a base coupled to the collector of the second bipolar junction transistor and to a base of the first bipolar transistor;
   a second resistor coupled between an emitter of the first bipolar junction transistor and the common reference; and
   wherein the first and second gate bipolar junction transistors are comprised of horizontal gate bipolar transistors.

17. The band gap voltage reference of claim 16, wherein the first and second horizontal gate bipolar junction transistors are matched such that the base emitter area of the first horizontal gate bipolar junction transistors is N times the base emitter area of the second horizontal gate bipolar junction transistor.

18. The band gap voltage reference of claim 17, wherein the first bipolar junction transistor is comprised of a plurality of horizontal gate bipolar junction transistors having a combined base emitter area of area N and the second bipolar junction transistor is comprised of a horizontal gate bipolar junction transistor having a base emitter area of area 1.

19. The band gap voltage reference of claim 16, wherein the base region of the horizontal bipolar gate transistors is less than 0.4 µm in width.

20. The band gap voltage reference of claim 16, wherein the first resistor is comprised of a plurality of taps to enable trimming of the band gap voltage reference.

21. The band gap voltage reference of claim 16, wherein one or more of the horizontal gate bipolar transistors are in parallel with a vertical NPN bipolar junction transistor.

22. The band gap voltage reference of claim 16, wherein the horizontal gate bipolar junction transistors are comprised of:
   an emitter formed from an n+ source region of an NMOS device;
   a base region formed from the channel of the NMOS device adjacent to the n+ source region and having a width of L=0.5 µm or less;
   a gate positioned above and in contact with the base region; and
   a collector formed from the drain region of the NMOS device and adjacent to the base region.

23. A flash memory device, comprising a band-gap voltage reference, the band gap voltage reference comprising:
   a current mirror coupled to a power source;
   a first bipolar junction transistor having a collector coupled to the current mirror;
   a second bipolar junction transistor having a collector coupled to the current mirror through a first resistor, an emitter coupled to a common reference and a base coupled to the collector of the second bipolar junction transistor and to a base of the first bipolar transistor;
   a second resistor coupled between an emitter of the first bipolar junction transistor and the common reference; and
   wherein the first and second gate bipolar junction transistors are comprised of horizontal gate bipolar transistors.

24. The flash memory device of claim 23, wherein the first and second horizontal gate bipolar junction transistors are matched such that the base emitter area of the first horizontal gate bipolar junction transistors is N times the base emitter area of the second horizontal gate bipolar junction transistor.

25. The flash memory device of claim 24, wherein the first bipolar junction transistor is comprised of a plurality of horizontal gate bipolar junction transistors having a combined base emitter area of area N and the second bipolar junction transistor is comprised of a horizontal gate bipolar junction transistor having a base emitter area of area 1.

26. The flash memory device of claim 23, wherein the base region of the horizontal bipolar gate transistors is less than 0.4 µm in width.

27. The flash memory device of claim 23, wherein the first resistor is comprised of a plurality of taps to enable trimming of the band gap voltage reference.

28. The flash memory device of claim 23, wherein one or more of the horizontal gate bipolar transistors are in parallel with a vertical NPN bipolar junction transistor.

29. The flash memory device of claim 23, wherein the horizontal gate bipolar junction transistors are comprised of:
  an emitter formed from an n+ source region of an NMOS device;
  a base region formed from the channel of the NMOS device adjacent to the n+ source region and having a width of L=0.5 µm or less;
  a gate positioned above and in contact with the base region; and
  a collector formed from the drain region of the NMOS device and adjacent to the base region.

30. A method for providing a voltage reference, comprising:
  coupling a current mirror to a power source;
  coupling a first bipolar junction transistor having a collector to the current mirror;
  coupling a collector of a second bipolar junction transistor to the current mirror through a first resistor;
  coupling an emitter of the second bipolar junction transistor to a common reference;
  coupling a base of the second bipolar junction transistor to the collector of the second bipolar junction transistor and to a base of the first bipolar transistor;
  coupling a second resistor between the emitter of the first bipolar junction transistor and the common reference; and
  wherein the first and second gate bipolar junction transistors are comprised of horizontal gate bipolar transistors.

31. The method of claim 30, wherein the first and second horizontal gate bipolar junction transistors, further comprise:
  an emitter formed from a first source/drain region of a MOS device;
  a base region formed from the channel of the MOS device adjacent to the first source/drain region and having a width of L=0.5 µm or less; and
  a collector formed from a second source/drain region of the MOS device and adjacent to the base region.

32. The method of claim 30, wherein the first and second horizontal gate bipolar junction transistors has a gain of at least 100 when the collector current is not more than 10 µA.

33. The method of claim 30, wherein one or more of the horizontal gate bipolar transistors are in parallel with a vertical NPN bipolar junction transistor.

34. The method of claim 30, wherein the first and second horizontal gate bipolar junction transistors are matched such that the base emitter area of the first horizontal bipolar junction transistor is N times the base emitter area of the second horizontal bipolar junction transistor.

35. The method of claim 34, wherein the first horizontal gate bipolar junction transistor further comprises two or more horizontal gate bipolar junction transistors coupled in parallel.

36. A flash memory circuit comprising:
  a non volatile memory, the non-volatile memory comprising a band gap reference voltage source, the band gap reference voltage source comprising:
    a current mirror coupled to a power source;
    a first bipolar junction transistor having a collector coupled to the current mirror;
    a second bipolar junction transistor having a collector coupled to the current mirror through a first resistor, an emitter coupled to a common reference, and a base coupled to the collector of the second bipolar junction transistor and to a base of the first bipolar transistor;
    a second resistor coupled between an emitter of the first bipolar junction transistor and the common reference; and
    wherein the first and second gate bipolar junction transistors are comprised of horizontal gate bipolar transistors.

37. A system comprising:
  a processor; and
  a non volatile memory, the non-volatile memory containing a band gap reference voltage source, the band gap reference voltage source comprising:
    a current mirror coupled to a power source,
    a first bipolar junction transistor having a collector coupled to the current mirror,
    a second bipolar junction transistor having a collector coupled to the current mirror through a first resistor, an emitter coupled to a common reference, and a base coupled to the collector of the second bipolar junction transistor and to a base of the first bipolar transistor,
    a second resistor coupled between an emitter of the first bipolar junction transistor and the common reference, and
    wherein the first and second gate bipolar junction transistors are comprised of horizontal gate bipolar transistors.

* * * * *

UNITED STATES PATENT AND TRADEMARK OFFICE
CERTIFICATE OF CORRECTION

PATENT NO. : 6,911,862 B2
DATED : June 28, 2005
INVENTOR(S) : Giulio G. Marotta et al.

It is certified that error appears in the above-identified patent and that said Letters Patent is hereby corrected as shown below:

<u>Column 4,</u>
Equation 13, "$NI_0 \, e^{(V_{be}-V_e)/V_1} = I_0 \, e^{V_{be}/V_1}$" should read
-- $NI_0 \, e^{(V_{be}-V_e)/V_t} = I_0 \, e^{V_{be}/V_t}$ --.
Equation 14, "$V_e = V_t \, In \, N = (kT \, In \, N) / q$" should read
-- $V_e = V_t \, \ln N = (kT \, \ln N) / q$ --.
Equation 18, "$V_{bg} = V_{be} + R_2 \, kT \, In \, N / R_1 \, q$" should read
-- $V_{bg} = V_{be} + R_2 \, kT \, \ln N / R_1 \, q$ --.
Equation 19, "$V_{bg2} = V_{be2} + R_2 \, kT_2 \, in \, N / R_1 q$" should read
-- $V_{bg2} = V_{be2} + R_2 \, kT_2 \, \ln N \, R_1 q$ --.
Equation 20, "$V_{bg1} = V_{be1} + R_2 \, kT_1 \, In \, N / R_1 q$" should read
-- $V_{bg1} = V_{be1} + R_2 \, kT_1 \, \ln N / R_1 q$ --.

<u>Column 5,</u>
Equation 21, "$V_{bg2} - V_{bg1} = V_{be2} - V_{be1} + R_2 \, k(T_2 - T_1) \, In \, N / R_1 \, q$" should read
-- $V_{bg2} - V_{bg1} = V_{be2} - V_{be1} + R_2 \, k(T_2 - T_1) \, \ln N / R_1 \, q$ --.
Equation 23, "$0 = V_{be} - V_{be1} + R_2 \, k(T_2 - T_1) \, In \, N / R_1 \, q$" should read
-- $0 = V_{be2} - V_{be1} + R_2 \, k(T_2 - T_1) \, \ln N / R_1 \, q$ --.
Equation 24, "$V_{be2} - V_{be1} = -R_2 \, k \, (T_2 - T_1) \, In \, N / R_1 \, q$" should read
-- $V_{be2} - V_{be1} = -R_2 \, k \, (T_2 - T1) \, \ln N / R_1 \, q$ --.
Equation 24, "$V_{be2} - V_{be1} / (T_2 - T_1) = -R_2 \, k \, In \, N / R_1 \, q$" should read
-- $V_{be2} - V_{be1} / (T_2 - T_1) = -R_2 \, k \, \ln N / R_1 \, q$ --.
Equation 25, "$-2 \times 10^{-3} = -R_2 \, k \, In \, N / R_1 \, q$" should read
-- $-2 \times 10^{-3} = -R_2 \, k \, \ln N / R_1 \, q$ --.
Equation 26, "$R_2 = 2R_1 q / 10^3 \, k \, In \, N$" should read
-- $R_2 = 2R_1 q / 10^3 \, k \, \ln N$ --.
Equation 27, "$R_2 = 2 \, R_1 \, q / 10^3 \, k \, \ln 2$" should read
-- $R_2 = 2 \, R_1 \, q / 10^3 \, k \, In \, 2$ --.
Equation 29, "$i_e = kT \, In \, 2 \, R_1 q$" should read
-- $i_e = kT \, \ln 2 \, R_1 q$ --.
Equation 30, "$R_1 = 10^{-6} \, kT \, In \, 2 / q$" should read
-- $R_1 = 10^{-6} \, kT \, \ln 2 / q$ --.
Equation 32, "$R_2 = 600 \, K'\Omega$" should read
-- $R_2 = 600 \, K\Omega$ --.
Equation 33, "$R1 = 17.9 \, K'\Omega$" should read
-- $R1 = 17.9 \, K\Omega$ --.

UNITED STATES PATENT AND TRADEMARK OFFICE
CERTIFICATE OF CORRECTION

PATENT NO. : 6,911,862 B2
DATED : June 28, 2005
INVENTOR(S) : Giulio G. Marotta et al.

It is certified that error appears in the above-identified patent and that said Letters Patent is hereby corrected as shown below:

<u>Column 7</u>
Line 48, "invention is shown in Fig. 2 where the R2 = 600 K'Ω" should read
-- invention is shown in Fig. 2 where the R2 = 600 KΩ --.

Signed and Sealed this

Thirtieth Day of May, 2006

JON W. DUDAS
*Director of the United States Patent and Trademark Office*